United States Patent [19]
Yoshikawa et al.

[11] Patent Number: 6,046,403
[45] Date of Patent: Apr. 4, 2000

[54] SOLAR BATTERY MODULE

[75] Inventors: Masato Yoshikawa; Tomoko Noguchi; Nobuko Kato, all of Kodaira, Japan

[73] Assignee: Bridgestone Corporation, Tokyo, Japan

[21] Appl. No.: 09/130,878

[22] Filed: Aug. 7, 1998

[30] Foreign Application Priority Data

Aug. 8, 1997 [JP] Japan ................................. 9-227603

[51] Int. Cl.⁷ ...................... H01L 31/0232; B01J 21/06
[52] U.S. Cl. .................. 136/257; 136/256; 502/308; 502/309; 502/350
[58] Field of Search ............................ 136/252, 256, 136/257; 502/308, 309, 350

[56] References Cited

U.S. PATENT DOCUMENTS

| | | | |
|---|---|---|---|
| 4,507,364 | 3/1985 | Kadokura et al. | 428/457 |
| 4,544,470 | 10/1985 | Hetrick | 204/248 |
| 4,636,578 | 1/1987 | Feinberg | 136/251 |
| 4,663,829 | 5/1987 | Hartman et al. | 29/572 |
| 5,476,553 | 12/1995 | Hanoka et al. | 136/151 |
| 5,498,297 | 3/1996 | O'Neill et al. | 136/246 |
| 5,578,502 | 11/1996 | Albright et al. | 437/4 |
| 5,897,958 | 4/1999 | Yamada et al. | 446/474 |

*Primary Examiner*—Nam Nguyen
*Assistant Examiner*—Michael C. Miggins
*Attorney, Agent, or Firm*—Sughrue, Mion, Zinn Macpeak & Seas, PLLC

[57] ABSTRACT

Disclosed is a solar battery module including: a solar battery cell; and a surface material laminated to cover a surface of said cell; wherein a photocatalyst layer is formed on said surface material. With this module, it is possible to prevent contamination to the surface material of a solar battery module and prevent loss of sunlight irradiation energy to the solar battery, and hence to maintain an electric generation power for a long time.

7 Claims, 3 Drawing Sheets

SOLAR BATTERY MODULE

BACKGROUND OF THE INVENTION

The present invention relates to a solar battery, and particularly to a solar battery module exhibiting an effect of preventing contamination to a surface material thereby preventing loss of irradiation energy of solar light to a solar battery.

A solar battery module of a crystal system (using a single crystal or polycrystalline silicon wafer) has a configuration, for example, shown in FIG. 1 in which a surface layer 22 is laminated by way of an adhesive layer 21 to the front surface of a solar battery cell 20, and an underlying film 24 is laminated by way of an adhesive layer 23 on the back surface. The surface material, which is mainly composed of a fluororesin film, has a problem that it is contaminated during long time use to cause a considerably loss of irradiation energy of the sunlight to the solar battery.

In an amorphous type solar battery module, a film of amorphous silicon is usually formed on a glass substrate used as a surface material to constitute a module structure, which also results in contamination to the surface material.

SUMMARY OF THE INVENTION

An object of the present invention is to provide a solar battery module capable of preventing contamination to a surface material as much as possible thereby maintaining a high electric generation power over a long period of time.

To achieve the above object, according to a first aspect of the present invention, there is provided a solar battery module including: a solar battery cell; and a surface material laminated to cover a surface of said cell; wherein a photocatalyst layer is formed on the surface material.

According to a second aspect of the present invention, in addition to the configuration of the first aspect, the above photocatalyst layer is formed on the surface material directly or by way of an underlying layer.

According to a third aspect of the present invention, in addition to the configuration of the first aspect, the above module further includes a photocatalyst film in which a photocatalyst layer is formed on one surface of a substrate directly or by way of an underlaying layer, and a pressure sensitive adhesive layer is formed on the other surface of said substrate; wherein said pressure sensitive adhesive layer is stuck on said surface material, to form a photocatalyst layer on said surface material.

According to a fourth aspect of the present invention, in addition to the configuration of any one of the first to third aspects, the above photocatalyst layer includes a metal oxide layer obtained by disposing a substrate on the side of a sputtering space between targets facing to each other, and forming a sputter layer on said substrate by reactive sputtering in an inert gas containing an oxygen molecule-containing gas using an facing target sputtering apparatus.

According to a fifth aspect of the present invention, in addition to the configuration of any one of the first to fourth aspects, the photocatalyst layer is a titanium oxide layer.

According to the present invention, since the photocatalyst layer made of titanium oxide or the like is formed on the surface material, even when contaminates such as dusts or finger prints are deposited to the photocatalyst layer on the surface, the photocatalyst is exited by photoirradiation by a light, for example, from the solar battery cell, and various contaminates deposited to the photocatalyst layer on the surface are decomposed and eliminated to prevent contamination as mush as possible.

In this case, the photocatalyst layer can be formed, for example, by a sputtering process. In view of improvement for the activation, it is effective to prepare a photocatalyst layer a titanium oxide film by an opposed target type sputtering process, and preferably to conduct sputtering with a volume ratio between an inert gas and an oxygen gas from an oxygen molecule-containing gas at 2:1 to 1:3 and, more preferably, by increasing the power applied to the target.

That is, the opposed target type sputtering process has been known, for example, by Japanese Patent Publication Nos. Sho 62-56575, Sho 63-20304 and Hei 3-1810, in which perpendicular magnetic recording thin films and the like are formed by the opposed target type sputtering process. Then, it is described that films of good crystallinity can be formed by this method.

In order to obtain a titanium film of high catalytical activity, it is necessary that the film is enriched with an anatase crystal system. When a film of titanium oxide is formed, while thin films of high crystallinity can be formed by various methods, the photocatalytic effect is low since most of crystal systems obtained are of rutile type. On the contrary, when a film of titanium oxide is formed by the facing target sputtering apparatus, an anatase rich photocatalyst layer can be prepared at a low temperature and, particularly, a photocatalyst layer enriched more with the anatase type crystals can be formed by adjusting the ratio between an argon gas and an oxygen gas to the above ratio, and the layer quality can be coarsened to enlarge the surface area by increasing the power applied, so that catalytical activity can be more increased.

DESCRIPTION OF THE PREFERRED EMBODIMENT

The present invention will be described in detail with reference to the accompanying drawings.

Figure 1:
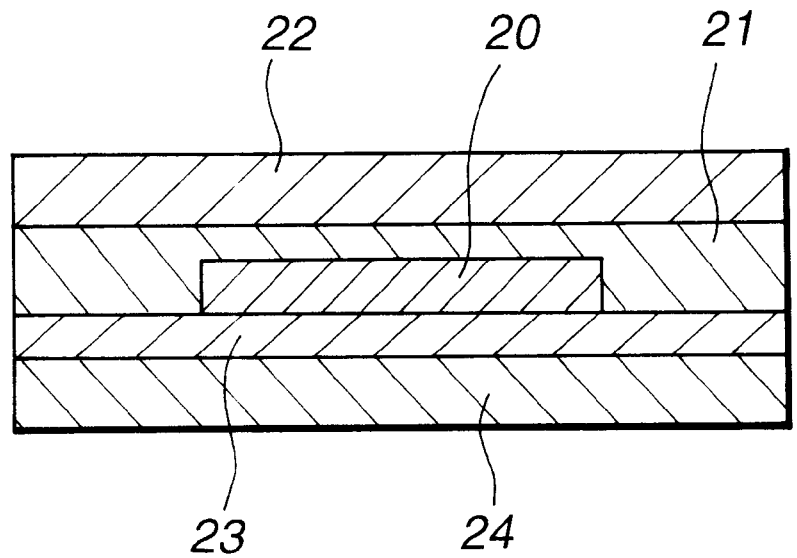
FIG. 1 is a sectional view showing one example of a solar battery module.

A solar battery module according to the present invention has such a configuration as shown in FIG. 1 in which a photocatalyst layer is formed on a surface material 22 to a thickness of 0.001 to 10 $\mu$m, preferably, 0.01 to 1 $\mu$m. The photocatalyst layer may be formed on the surface material directly or, preferably, by way of an underlying film. Alternatively, a photocatalyst film 10 shown in FIG. 2 may be stuck on the surface material.

Figure 2:
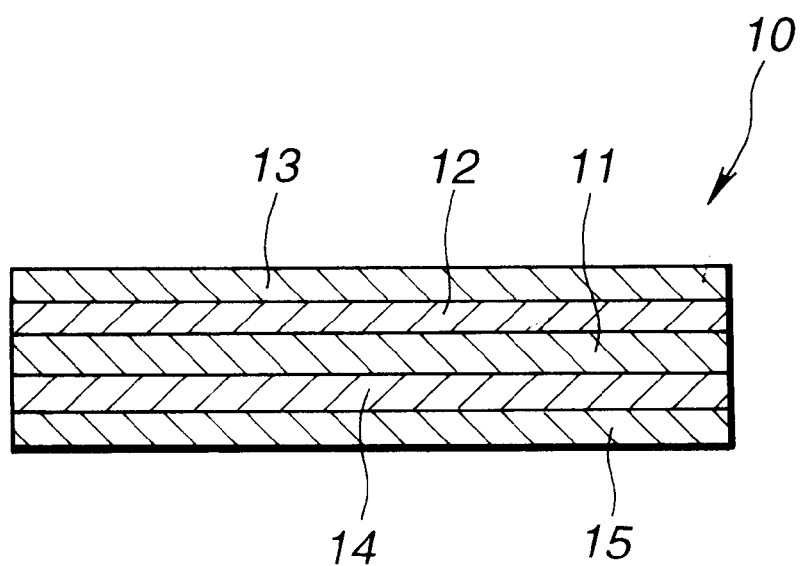
FIG. 2 is a sectional view showing one example of a photocatalyst layer.

As shown in FIG. 2, the photocatalyst film 10 is configured such that a photocatalyst layer 13 is formed by way of an underlying layer 12 on one surface of a substrate 11; an adhesive layer 14 is formed on the other surface of the substrate 11; and, if necessary, a releasing film 15 is releasably stuck on the adhesive layer 14. In addition, the photocatalyst film 10 is preferably formed to be transparent entirely except for the releasing film 15.

As the substrate, there is preferably used a transparent plastic film made from polyester, acrylic resin, cellulose or polycarbonate. The thickness is, while not exclusively, is usually in a range of 10 to 300 $\mu$m, preferably, 20 to 100 $\mu$m.

The underlying layer can be omitted, if needed but may be preferably formed if a plastic film is used as the substrate for preventing degradation of the substrate. The underlying layer is suitably made from a transparent oxide not having a photocatalyst activity such as $SiO_2$, $Al_2O_3$ or ITO, and a transparent material less photodegradable such as a sulfide, nitride, boride or carbide of a metal. The thickness of the underlying layer may be suitably selected, and is usually in a range of 10 to 5 µm, preferably, 20 to 1 µm. The underlying layer can be formed by a sputtering process, vapor-phase plating process such as vacuum-deposition, or other appropriate means.

On the other hand, the adhesive layer can be formed of a known acrylic or epoxy type pressure sensitive adhesive, or heat or light crosslinked pressure sensitive adhesive formed by adding an organic peroxide or a photoinitiator to an ethylene-vinyl acetate copolymer. The thickness is usually in a range of 1 to 500 µm, preferably, 5 to 100 µm.

As the releasing film, any known type can be used.

The photocatalyst film 10 is used by removing the releasing film 15 and sticking the pressure sensitive adhesive layer 14 on the surface material of the solar battery module.

The kind, thickness and the formation method of the underlying layer through which the photocatalyst layer is formed on the surface material, are the same as described above.

In the present invention, the photocatalyst layer can be made from an oxide of a metal having a photocatalytic activity such as titanium, zinc, tungsten or iron. While not exclusively, the photocatalyst layer is preferably formed by reactive sputtering in an inert gas containing an oxygen molecule-containing gas using a metal target.

Sputtering can be conducted by a known process, for example, a usual magnetron sputtering process, and preferably by a facing target sputtering apparatus.

Figure 3:
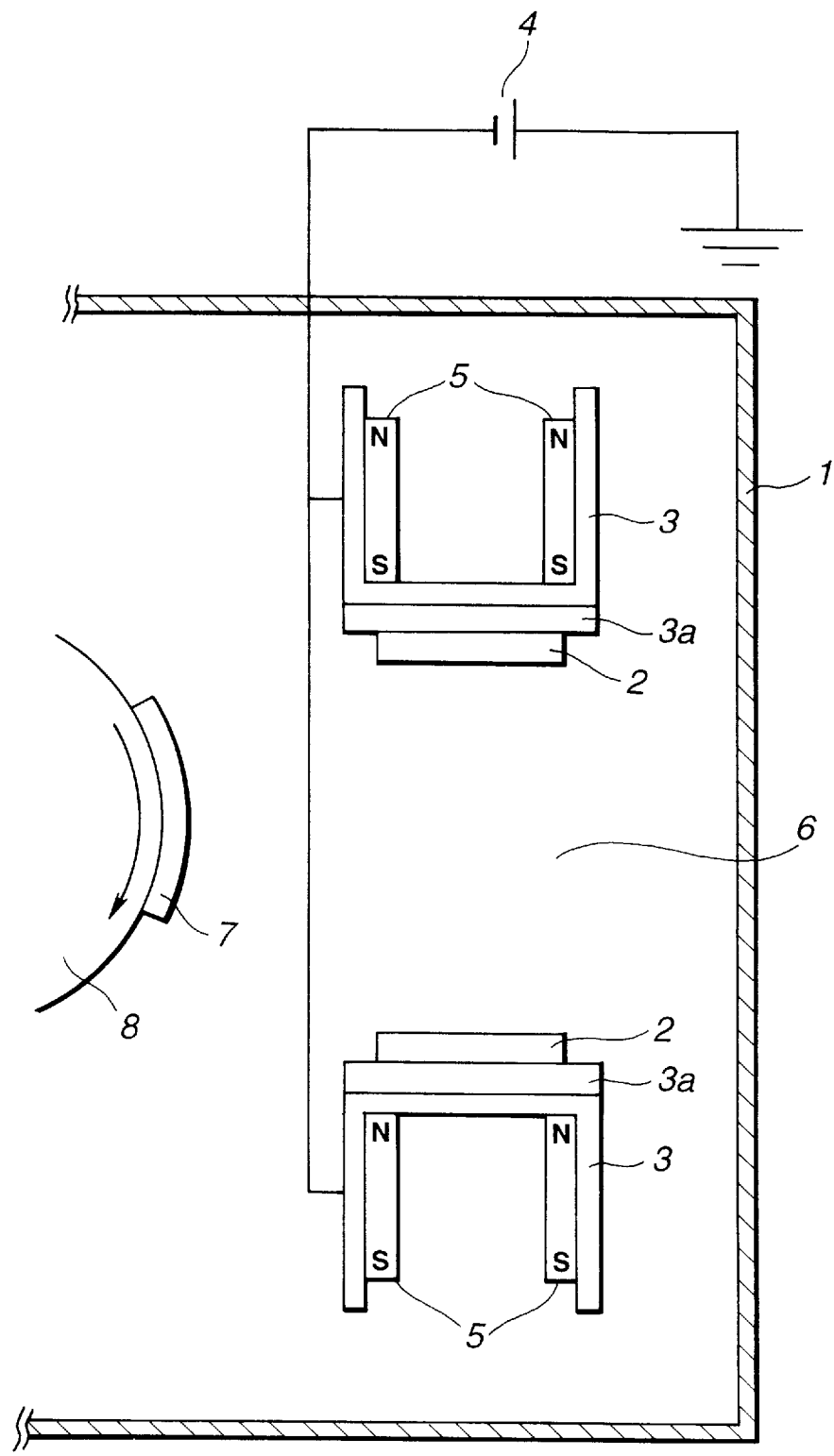
FIG. 3 is a schematic view showing one example of an facing target sputtering apparatus.

As a facing target sputtering apparatus, there can be used a known system typically shown in FIG. 3. In FIG. 3, reference numeral 1 denotes a system main body the inside of which can be degassed and evacuated. A pair of metal targets 2, spaced at a specific gap, are oppositely disposed in the system main body 1. The targets 2 are held on holders 3 having supports 3a respectively, and connected by way of the holders 3 to the cathodes of a DC power source 4 (sputtering power source). Magnets 5 are disposed at the back of the targets 2 such that different magnetic poles are opposed to generate magnetic fields in the direction perpendicular to the targets 2 in a sputtering space 6 between the targets 2. Then, a substrate 7 on which a sputter film is to be formed is disposed on the side of the sputtering space 6. Reference numeral 8 denotes a supporting member 8 for supporting the substrate 7 movably in a predetermined direction.

As a metal target used for sputtering using the such a system to form a photocatalyst layer on the substrate, there may be used a metal oxide MeOx having a photocatalytical activity (Me represents a metal such as Al, Co, Cu, Fe, In, Mg, Sn, Ti or Zn and x is a positive number within a range of 0 to 10, preferably, 0 to 5 while varying depending on the kind of the metal, but x is not always necessary to correspond to the valence number of the metal). As the above metal Me, titanium forming a titanium oxide film is preferably used.

Before sputtering, an inert gas and oxygen molecule-containing gas are introduced after the vacuum degree is set at a value of 0.1 to 100 mTorr, particularly, 1 to 30 mTorr. A known gas can be used as an oxygen molecule-containing gas supplied to the sputtering space (oxidative gas). Specifically, oxygen, ozone, air or water can be used, and oxygen is usually used. Further, helium, argon or the like can be used as the inert gas and, particularly, argon which is industrially inexpensive can be suitably used.

In this case, the inert gas and the oxygen molecule-containing gas are preferably introduced at a ratio of the inert gas and the oxygen gas of 2:1 to 1:3, particularly, 1.5:1 to 1:2 (by volume ratio). This enables to form highly active anatase rich titanium oxide crystals upon formation of a film of titanium oxide. Out of the range of the above ratio, there may be an inconvenience that the ratio of rutile type crystals is increased. The flow rate of the gas is suitably selected depending on the size of the chamber and the number of cathodes, usually in a range of about 2 to 1000 cc/min as the total amount of the inert gas and the oxygen molecule-containing gas.

The electric power applied is suitably selected, and is preferably set at a high value. For example, it is recommended to use electric power of 400 W or more, particularly, 800 W or more in the case of using two targets of 100 mm diameter. In this case, it is recommended that the amount of energy per target area is 1.3 $W/cm^2$ or more, preferably, 2.6 $W/cm^2$ or more and, more preferably, 5.1 $W/cm^2$ or more. Since the film quality of the photocatalyst layer thus formed can be coarsened and the surface area can be increased, the performance of the photocatalyst layer can be further improved. If the electric power applied is less than 400 W, and the amount of energy per target area is less than 1.3 $W/cm^2$, a photocatalyst layer having a high activity can not be certainly obtained.

While a DC current is used for the power source in the example shown in the figure, the present invention is not limited thereto. For example, a high frequency power source or the like can be used. The configuration of the system is also not limited to that in the example shown in the figure.

Other conditions of the sputtering are not particularly limited. In other words, known conditions can be adopted. For example, the pressure upon sputtering may be set in a range of 1 mTorr to 1 Torr.

In this case, ions of a metal such as platinum, nickel, chromium, cobalt, tin, niobium or tantalum can be ion-implanted in the surface of the metal oxide film at about $1 \times 10^{15}$ to $1 \times 10^{18}$ ions/$cm^2$ by a known ion implantation process and system. Such ion-implantation is effective to form a photocatalyst layer having a higher activity.

Figure 4:
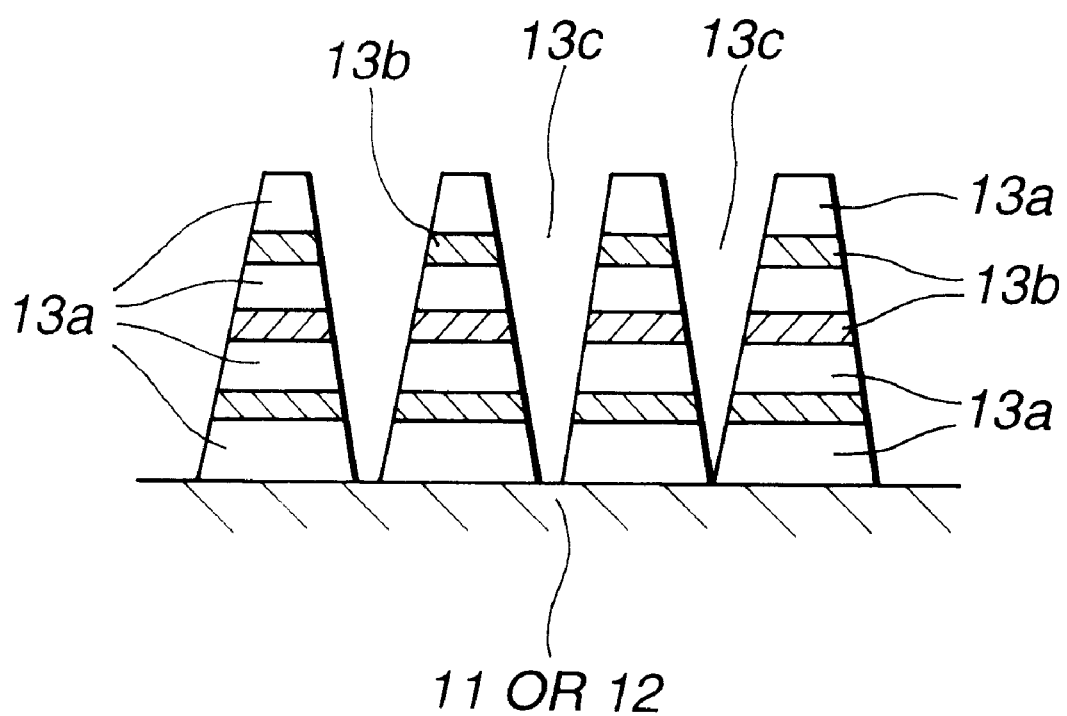
FIG. 4 is a schematic sectional view showing one example of a photocatalyst layer.

According to the present invention, the photocatalyst layer 13 is prepared, as shown in FIG. 4, by alternately laminating metal oxide films 13a formed as described above and thin films 13b of a metal selected from platinum, nickel, chromium, cobalt, tin, niobium and tantalum or an oxide thereof such that the thin metal oxide film 13a is on the uppermost surface layer and by forming a plurality of holes or grooves 13c of a depth reaching from the uppermost surface layer to the lowermost layer. With this configuration, the specific surface area of the photocatalyst layer 13 can be increased and the photocatalyst activity is further increased by the charge separation promoting effect of the photocatalyst of the thin film of metal or oxide thereof. The total number of the metal oxide films 13a or the metal or oxide thin films 13b can be set in a range of two to several tens, and the thickness per one layer can be set in a range of 20 to 200, preferably, about 20 to 50. The holes or grooves can be formed by laser processing or the like and the shape of them is not limited to a V-shape shown in the figure but can be variously selected. Further, the number of holes or grooves is not limited, and the grooves can be usually formed with a pitch of 0.001 to 5 mm.

The configuration of the solar battery module according to the present invention can be the same as the known configuration except for formation of the photocatalyst layer as described above on the surface material. As the constituent materials, there can be used known materials. For example, a transparent material is mainly used as the surface material because the surface material is required to supply solar light energy efficiently to a battery layer. In general, an inorganic material (glass) is used as the surface material. On the other hand, an organic film such as a polyester film, nylon film or acryl films can be used as the surface material; however, since such a organic film is poor in weather proofness, fluororesin film such as an ETFE or FEP is actually used as the surface material. According to the present invention, since the weather proofness and the like can be improved by formation of the photocatalyst layer on the surface, the above polyester film may be used as the surface material. As an adhesive for bonding the surface material to the solar battery cell, an EVA type adhesive can be used.

The present invention will be more fully understood by way of, while not exclusively, an inventive example and a comparative example.

[Inventive Example and Comparative Example]

A fluororesin film (ETFE: ethylene-tetrafluoroethylene copolymer) having a width of 300 mm was subjected to corona discharging treatment in a nitrogen atmosphere to activate the surface of the film. Then, the film was placed in a roll coater type sputtering system, which was evacuated by a vacuum pump. The pressure in the chamber was set to 5 mTorr by supplying an argon gas at a flow rate of 50 cc/min and an oxygen gas at a flow rate of 50 cc/min. A power at 3 kW was applied from a DC current source to a silicon target by a magnetron sputtering gun, and a silicon oxide film of 50 Å was coated on the ETFE film at a moving rate of 1 m/min. Then, a power of 6 kW was applied by a DC current source to opposed target sputtering cathodes having two titanium targets (100×400 mm) attached thereto, and a film was formed at a sheet moving rate of 10 mm/min to form a titanium oxide film of about 2000 Å on the ETFE film.

A solar battery cell was put between an underlying film (aluminum tedler film) and the above titanium oxide coated fluororesin film as a surface window material using an ethylene-vinyl acetate copolymer type transparent adhesive, followed by lamination by the above adhesive, to prepare a solar battery module shown in FIG. 1.

The solar battery module was placed in the outdoor suffering from violent contamination, and solar light electric generation amount was measured. For a comparison, a solar battery module not coated with any titanium oxide was used.

The results are shown in Table 1. In Table 1, numerical values show the ratio of the electric generation amount before and after leaving for one month.

TABLE 1

|  | Surface Contamination | Generation Amount Keeping Rate |
| --- | --- | --- |
| Comparative Example | Dusts are present | 0.92 |
| Inventive Example | No substantial contamination | 0.98 |

As shown in Table 1, the module coated with the titanium oxide had no contamination deposition because contaminations on the surface were self-cleaned, and also showed high keeping ratio for the electric generation amount.

According to the present invention, the electric generation amount can be maintained over a long period of time by preventing contamination on the surface material of a solar battery module and preventing loss of irradiation energy of solar light to the solar battery.

What is claimed is:

1. A solar battery module comprising:
   a solar battery cell;
   a surface material laminated to cover a surface of said solar battery cell; and
   a photocatalyst film having a photocatalyst layer made of titanium oxide is formed on one surface of a substrate directly or by way of an underlaying layer, and an adhesive layer is formed on an opposite surface of said substrate, wherein said adhesive layer is a heat or light crosslinked adhesive formed by adding an organic peroxide or a photoinitiator to an ethylene-vinyl acetate copolymer to form the photocatalyst layer on said surface material.

2. A solar battery module according to claim 1 wherein said photocatalyst layer comprises a metal oxide layer.

3. A solar battery module according to claim 11, wherein said surface material is fluororesin.

4. A solar battery module according to claim 1, wherein said photocatalyst layer has a thickness in the range of 0.001 to 10 μm.

5. A solar battery module according to claim 1, wherein said substrate is a transparent plastic film having a thickness in the range of 10 to 300 μm.

6. A solar battery module according to claim 5, wherein said transparent plastic film is a material selected from the group consisting of polyester, acrylic resin, cellulose or polycarbonate.

7. A solar battery module according to claim 1, wherein said adhesive layer has a thickness in the range of 1 to 500 μm.

* * * * *